US007173316B2

(12) United States Patent
Tateyama

(10) Patent No.: US 7,173,316 B2
(45) Date of Patent: Feb. 6, 2007

(54) SEMICONDUCTOR DEVICE

(75) Inventor: Yuichi Tateyama, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/003,383

(22) Filed: Dec. 6, 2004

(65) Prior Publication Data
US 2005/0098849 A1 May 12, 2005

(30) Foreign Application Priority Data
Dec. 8, 2003 (JP) ............... 2003-409287

(51) Int. Cl.
H01L 29/74 (2006.01)
H01L 21/8238 (2006.01)
(52) U.S. Cl. ............ 257/509; 257/528; 257/595; 257/592; 257/552; 438/208; 438/379
(58) Field of Classification Search ........... 252/528, 252/590, 595, 594, 593, 597, 596
See application file for complete search history.

(56) References Cited
U.S. PATENT DOCUMENTS
6,458,632 B1 * 10/2002 Song et al. .............. 438/133

6,514,781 B2 * 2/2003 Chang et al. ............ 438/253
6,552,399 B2 * 4/2003 Jun et al. ................ 257/357
6,724,050 B2 * 4/2004 Salling et al. ........... 257/362

FOREIGN PATENT DOCUMENTS
JP    10335371    12/1998
JP    2000150798    5/2000

* cited by examiner

Primary Examiner—Nathan J. Flynn
Assistant Examiner—Fazli Erdem
(74) Attorney, Agent, or Firm—Stevens, Davis, Miller & Mosher, LLP

(57) ABSTRACT

An N type semiconductor layer is epitaxially grown on a P type semiconductor substrate of which one end is grounded, and an element isolation layer made of a P type diffusion layer is formed by means of diffusion around the N type semiconductor layer in order to electrically isolate the N type semiconductor layer. The metal layer which is located above the N type semiconductor layer and which forms a wire or a bonding pad is isolated from the N type semiconductor layer in which a diffusion layer or the like has been formed by an insulating film. An N type buried diffusion layer having an impurity concentration higher than that of the N type semiconductor layer is provided between the P type semiconductor substrate and the N type semiconductor layer. In addition, a P type semiconductor layer is formed by means of diffusion between the insulating film and the N type semiconductor layer plus the element isolation layer.

2 Claims, 10 Drawing Sheets

SEMICONDUCTOR DEVICE

BACKGROUND OF THE INVENTION

1. Field of the Invention

The present invention relates to a semiconductor device which is applied to a crystal oscillating circuit or the like, and which is provided with a metal layer that becomes a wire or a bonding pad.

2. Prior Art

In a conventional crystal oscillating circuit or the like, a wire or a bonding pad is formed as a metal region within the semiconductor device. FIG. 7 is a circuit diagram showing the configuration of a crystal oscillating circuit. In FIG. 7, symbol 10 indicates a semiconductor integrated circuit. Symbol 11 indicates a crystal oscillator. Symbol 12 indicates a variable capacitance diode. Symbols 23, 24 and 25 indicate bonding pads. Symbols 20, 37, 38 and 39 indicate resistors. Symbols 21 and 22 indicate capacitors. Symbols 30, 31, 32, 33, 34, 35 and 36 indicate parasitic capacitances. Symbol 40 indicates a transistor.

This crystal oscillating circuit is formed of semiconductor integrated circuit 10, crystal oscillator 11 and variable capacitance diode 12 which works on crystal oscillator 11 so as to make the oscillation frequency variable. Crystal oscillator 11 and variable capacitance diode 12 are connected to each other in series. Both ends of the series circuit of crystal oscillator 11 and variable capacitance diode 12 are connected to semiconductor integrated circuit 10 via bonding pads 23 and 25, respectively.

In addition, parasitic capacitances are added to the respective circuit elements of semiconductor integrated circuit 10 in a distributed manner. For example, parasitic capacitance 33 is added to bonding pad 23, parasitic capacitance 34 is added to resistor 37, parasitic capacitance 35 is added to resistor 38, parasitic capacitance 36 is added to resistor 39, parasitic capacitance 30 is added to resistor 20, parasitic capacitance 31 is added to capacitor 21, and parasitic capacitance 32 is added capacitor 22.

In FIG. 7, bonding pads 23, 24 and 25 are formed of metal layers, for example, and the structures of and the portions beneath these metal layers are the same. FIG. 8 shows the structure of and the portion beneath a metal layer. In addition, FIG. 9 shows the condition of a connection of parasitic capacitances that are added to the portion beneath a metal layer which forms a bonding pad.

FIG. 8 is a cross-sectional diagram showing a cross-section of a structure in the vicinity of a metal region of which the structure is the same for a wire and a bonding pad. In FIG. 8, symbol 53 indicates a P type semiconductor substrate made of a P type silicon substrate. One end of this P type semiconductor substrate 53 is grounded. Symbol 51 indicates an N type semiconductor (silicon) layer that has been epitaxially grown on P type semiconductor substrate 53. A diffusion layer for constructing a transistor in a crystal oscillating circuit, for example, is formed in this N type semiconductor layer 51. Symbol 52 indicates an element isolation layer made of P type diffusion layers that have been diffused from both sides, upper and lower, of N type semiconductor layer 51, in order to electrically isolate N type semiconductor layer 51. Symbol 55 indicates a metal layer of which the main component is aluminum, and which forms a wire or a bonding pad. Symbol 50 indicates an insulating film for insulating metal layer 55 from N type semiconductor layer 51 where a diffusion layer or the like has been formed. Insulating film 50 is formed of a silicon nitride film having a thickness of 15 nm, for example.

Symbol 54 indicates an N type buried diffusion layer of which the impurity concentration is higher than that of N type semiconductor layer 51. After N type buried diffusion layer 54 has been formed on P type semiconductor substrate 53, N type semiconductor layer 51 is epitaxially grown. N type buried diffusion layer 54 is formed in order to lower the resistance component of N type semiconductor layer 51 that has been epitaxially grown, and, at the same time, in order to increase the withstand voltage between N type semiconductor layer 51 and P type semiconductor layer (element isolation layer 52 plus P type semiconductor substrate 53).

In the above described configuration, parasitic capacitances 30 to 36 are formed between capacitors 21 and 22 in FIG. 7 and the P type semiconductor substrate that forms semiconductor integrated circuit 10 in FIG. 7, as well as between resistors 20, 37, 38 and 39 and the P type semiconductor substrate.

Each parasitic capacitance 30 to 36 is, as shown in FIG. 9, formed of a parasitic capacitance 60 (capacitance value C1) between metal layer 55 that becomes a wire or a bonding pad and N type semiconductor layer 51, and of a parasitic capacitance 61 (capacitance value C2) in the junction between N type semiconductor layer 51 and P type semiconductor substrate 53. Here, an imaginary electrode A is connected to metal layer 55, and an imaginary electrode B is connected to N type semiconductor layer 51.

FIG. 9 is a diagram of an equivalent circuit, showing the condition of the connection of parasitic capacitances 60 and 61, which occur between the respective layers of FIG. 8. Parasitic capacitance 60 is a parasitic capacitance formed between metal layer 55 and N type semiconductor layer 51, which respectively make contact with the two surfaces of insulating film 50. Parasitic capacitance 61 is a parasitic capacitance formed between N type buried diffusion layer 54 plus N type semiconductor layer 51 and P type semiconductor substrate 53 plus element isolation layer 52.

An equivalent circuit of the portion between electrode A which is connected to metal layer 55 and P type semiconductor substrate 53 which is grounded has, as shown in FIG. 9, the configuration where parasitic capacitance 60 and parasitic capacitance 61 are connected in series between electrode A and the ground. Electrode B is connected to the connected portion between parasitic capacitance 60 and parasitic capacitance 61. Here, parasitic capacitance 60 is determined by the dielectric constant and the thickness of insulating film 50, and by the area of the border, and has a fixed value. On the other hand, parasitic capacitance 61 is determined by the thickness and the area of a depletion layer on the surface that makes contact with the diffusion layer. The thickness of this depletion layer fluctuates depending on the value of the voltage which is applied across the two surfaces of this depletion layer, and thus, the value of parasitic capacitance 61 fluctuates in accordance with the value of this voltage.

FIG. 10 shows the fluctuations of the voltages at electrodes A and B by taking the lapse of time from the time when a voltage is applied to electrode A of FIG. 9 along the lateral axis, and by taking the voltages at electrodes A and B of FIG. 9 along the longitudinal axis. In FIG. 10, waveform A1 shows the waveform of the voltage at electrode A of FIG. 9. That is to say, waveform A1 shows the waveform of the voltage at bonding pad 23 made of a metal layer in FIG. 7. Waveform B1 shows the waveform of the voltage at electrode B of FIG. 9. That is to say, waveform B1 shows the waveform of the voltage at the layer that corresponds to electrode B within the structure beneath resistor 38 in FIG. 7.

In the following, the waveforms of FIG. 10 are described in reference to the configuration of FIG. 7.

In FIG. 7, when a voltage from the voltage source is applied to bonding pad 24, the circuits that are connected to this bonding pad 24 operate, and a voltage that has been determined by the series of circuits is applied to resistor 38.

Waveform A1 shows the waveform of the voltage that is applied to bonding pad 23. That is to say, waveform A1 shows the manner in which the voltage that is applied to bonding pad 23 is shifted to a constant voltage value in a period of time that is no longer than 0.01 second, and at the same time, the oscillation waveform of approximately 13 MHz that has been generated by crystal oscillator 11 is maintained.

Waveform B1 shows the waveform of the voltage at electrode B. That is to say, waveform B1 shows the manner in which the voltage at electrode B1 reaches a predetermined voltage value in a period of time that is no longer than 0.01 second, and after that, gradually decreases. The voltage of waveform B1 decreases, and thereby, the value of parasitic capacitance 61, which is shown in FIG. 9, changes. The capacitance value between electrode A and the ground also fluctuates along with the fluctuation in the value of parasitic capacitance 61.

The fluctuation in the voltage of waveform B1 is more concretely described in the following, in reference to FIG. 9. When a voltage is applied to electrode A of FIG. 9, parasitic capacitance 60 and parasitic capacitance 61 are rapidly charged, and a voltage which is gained by dividing the voltage across electrode A and the ground in accordance with the values of parasitic capacitances 60 and 61 is outputted to electrode B. However, a microscopic amount of diffusion current in accordance with the concentration of the junction in parasitic capacitance 61 flows out of the junction in the direction toward the ground from electrode B, and therefore, the potential of electrode B decreases, along with the flow of this charge. It generally takes a time period of at least ten seconds or more before the potential of electrode B is lowered to the ground.

When the potential of electrode B decreases as described above in FIG. 9, the capacitance value of parasitic capacitance 61 changes, and so does the capacitance value between electrode A and the ground. As a result of this, the capacitance value that has been parasitically added to resistor 38 in FIG. 7 also changes. The oscillation frequency of crystal oscillator 11 changes along with the change in the parasitic capacitance value that is added to resistor 38.

Next, the value of this parasitic capacitance and the fluctuation in the oscillation frequency are described. In an example where the parasitic capacitance value is found through calculation from the areas occupied by and the materials of the respective structures of the semiconductor integrated circuit, the value of parasitic capacitance 60 in FIG. 9 is, for example, 1.18 pF. In addition, as for the value of parasitic capacitance 61, the value immediately after power on is, for example, 4 pF, while the value after ten seconds from power on changes to 5 pF. In this case, the capacitance value between electrode A and the ground is found in a manner where 0.9112 pF immediately after power on changes to 0.9547 pF after ten seconds. The ratio of this change in the capacitance value is 4.6%.

On the other hand, the frequency of the oscillation waveform at bonding pad 23 in FIG. 7 is measured in the manner where the frequency value fluctuates by 0.3 ppm ten seconds after power on. In an oscillator that outputs the signal that becomes the reference in a cellular phone, for example, the allowable fluctuation range of the frequency is plus/minus 0.2 ppm. Accordingly, the above described 0.3 ppm is a value on the borders of the standard.

In a conventional cellular phone, as shown in FIG. 7, an oscillating circuit is formed of semiconductor integrated circuit 10, crystal oscillator 11 and variable capacitance diode 12. In order to connect semiconductor integrated circuit 10 to crystal oscillator 11 or the like, it is necessary to make connections to crystal oscillator 11 or the like via bonding pads 23 and 25 within semiconductor integrated circuit 10.

However, as shown in FIG. 9, parasitic capacitances are added to the respective capacitors and resistors, and in addition, the values of the parasitic capacitances fluctuate along with a discharge. Such fluctuations in the parasitic values take a time period of no less than ten seconds after power on, and during this time, the oscillation frequency gradually changes in accordance with this fluctuation in the parasitic capacitance values. The range of the change in the frequency during this time period is 0.1 Hz to 10 Hz, and in some cases, this numeral value exceeds 0.3 ppm, which is an allowable value for the frequency fluctuation ten seconds after power on, and which is required for a cellular phone.

SUMMARY OF THE INVENTION

An object of the present invention is to provide a semiconductor device having a structure of a wire or of a bonding pad that can gain a stable oscillation frequency in the case of use in an oscillation circuit in a cellular phone or the like, where stability of oscillation frequency with high precision is required.

In order to achieve the above described object, the semiconductor device of the first invention is provided with: a first semiconductor layer of a first conductivity type; a second semiconductor layer of a second conductivity type which is different from the first conductivity type, formed on the first semiconductor layer; an element isolation layer for electrically isolating the second semiconductor layer, which is formed on the first semiconductor layer and around the second semiconductor layer; a first insulating film formed on the second semiconductor layer; a metal layer which is formed on the first insulating film, and which becomes a wire or a bonding pad; and a voltage clamp means for clamping the potential of the second semiconductor layer.

According to the semiconductor device of the first invention, the potential of the second semiconductor layer is clamped by a voltage clamp means, and therefore, no charge is induced by a voltage to the second semiconductor layer of the second conductivity type, even in the case where the voltage is applied to the metal layer. Accordingly, a change in the parasitic capacitance that is added to the metal layer during the course of time can be suppressed. In particular, in the case where the configuration of the first invention is applied to the capacitors and resistors which form an oscillation circuit such as that of a cellular phone, the fluctuation in the oscillation frequency can be suppressed so that an oscillation circuit that satisfies an allowable error margin of 0.3 ppm, for example, can be implemented.

The semiconductor device of the second invention has the configuration of the first invention, wherein the element isolation layer is formed of a semiconductor region of the first conductivity type, and the voltage clamp means is formed of the element isolation layer and a third semiconductor layer of the first conductivity type which is formed between the second semiconductor layer and the first insulating film, and which makes contact with the element isolation layer.

According to the semiconductor device of the second invention, the first semiconductor layer, the element isolation layer and the third semiconductor layer are made of regions of the same first conductivity type. Therefore, when the first semiconductor layer is set at the ground potential, the third semiconductor layer becomes of the ground potential through the element isolation layer, from the first semiconductor layer. As a result of this, the potential of the lower surface of the first insulating film that makes contact with the third semiconductor layer can be set at the ground potential, and therefore, no charge is induced by a voltage to the second semiconductor layer of the second conductivity type, even in the case where the above described voltage is applied to the metal layer. Accordingly, a change in the parasitic capacitance that is added to the metal layer during the course of time can be suppressed. In particular, in the case where the configuration of the second invention is applied to the capacitors and resistors which form an oscillation circuit such as that of a cellular phone, where stability in the oscillation frequency with high precision is required, the fluctuation in the oscillation frequency can be suppressed so that an oscillation waveform having high frequency stability can be gained. An oscillation circuit that satisfies an allowable error margin of 0.3 ppm, for example, can be implemented.

The semiconductor device of the third invention has the configuration of the first invention, wherein the voltage clamp means is formed of a wiring means for voltage clamping which is connected to the second semiconductor layer so as to provide a predetermined potential to the second semiconductor layer.

According to the semiconductor device of the third invention, a wiring means for voltage clamping is provided so that a predetermined potential can be provided to the second semiconductor layer, and thereby, the potential on the lower surface of the first insulating film that makes contact with the second semiconductor layer can be set as a fixed potential. As a result of this, even in the case where a voltage is applied to the metal layer, no charge is induced to the second semiconductor layer by the above described voltage, and therefore, a change in the parasitic capacitance that is added to the metal layer during the course of time can be suppressed. In particular, in the case where the configuration of the third invention is applied to the capacitors and resistors which form an oscillation circuit such as that of a cellular phone, where stability in the oscillation frequency with high precision is required, the fluctuation in the oscillation frequency can be suppressed so that an oscillation waveform having high frequency stability can be gained. An oscillation circuit that satisfies an allowable error margin of 0.3 ppm, for example, can be implemented.

The semiconductor device of the fourth invention is provided with a second insulating film formed in a region that includes the metal layer, between the first insulating film and a polysilicon layer, in the semiconductor device of the first invention.

According to the semiconductor device of the fourth invention, the thickness of the insulating film (first or second insulating film) directly beneath the metal layer can be increased to, for example, a thickness of approximately 350 nm. As a result of this, the amount of charge that occurs in the second semiconductor layer directly beneath the metal layer can further be reduced. By reducing this amount of charge, a change in the parasitic capacitance that is added to the metal layer with the lapsing of time can be suppressed. Accordingly, in the case of application to an oscillating circuit, the amount of fluctuation in the oscillation frequency can further be reduced. Here, the second insulating film may be formed of a silicon oxide film, a silicon nitride film or a resin.

DESCRIPTION OF THE PREFERRED EMBODIMENTS

In the following, the embodiments of the present invention are described in reference to the drawings.

[Embodiment 1]

Figure 1:
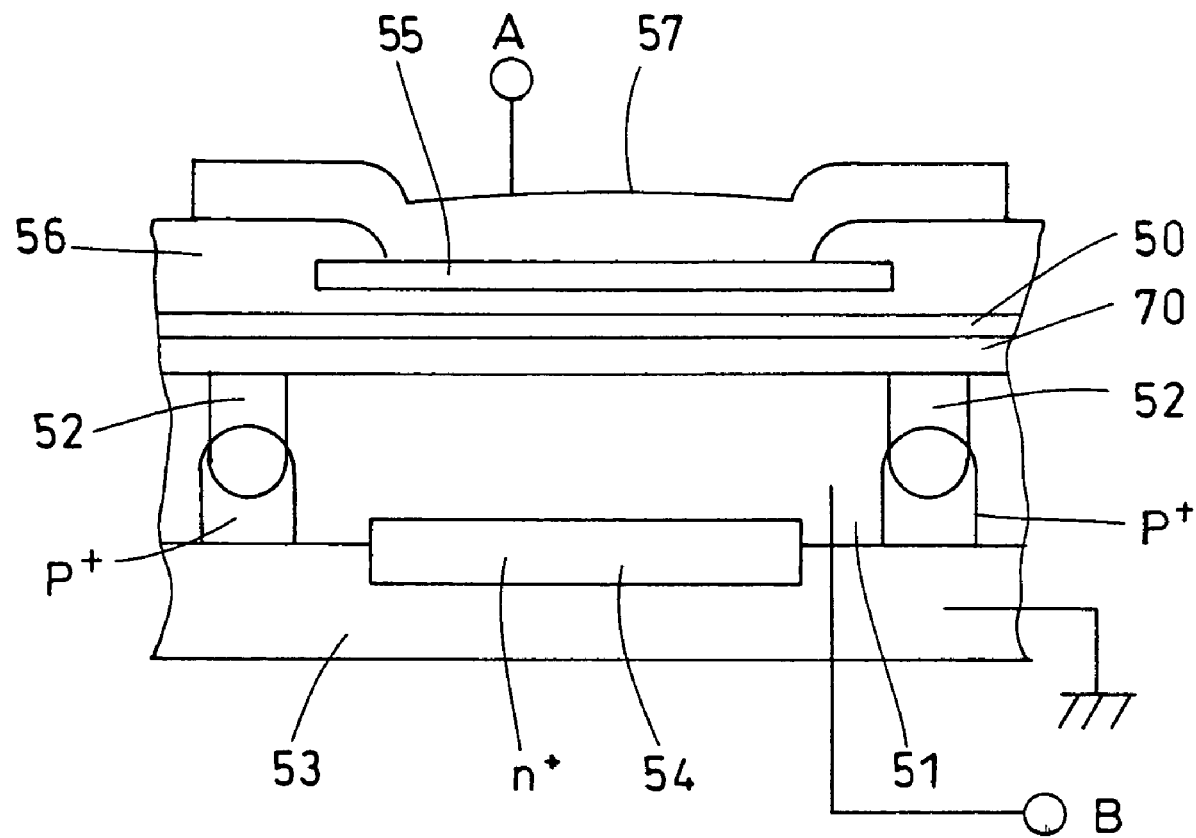
FIG. 1 is a cross-sectional diagram showing a cross-section of the structure of the metal layer and the area in its vicinity in the semiconductor device according to Embodiment 1 of the present invention.

FIG. 1 is a cross-sectional view showing a cross-section of the structure of the metal layer and the area in its vicinity in the semiconductor device according to Embodiment 1 of the present invention. In FIG. 1, symbol 53 indicates a P type semiconductor substrate (first semiconductor layer). Symbol 50 indicates an insulating film (first insulating film). Symbol 51 indicates an N type semiconductor layer (second semiconductor layer) that has been epitaxially grown on P type semiconductor substrate 53. Symbol 52 indicates an element isolation layer formed of the P type diffusion layers that have been diffused from the two sides, upper and lower, of N type semiconductor layer 51 in order to electrically isolate N type semiconductor layer 51. Symbol 54 indicates an N type buried diffusion layer. Symbol 55 indicates a first metal layer that becomes a wire or a bonding pad. Symbol 70 indicates a P type semiconductor layer (third semiconductor layer). Symbol 56 indicates an insulating film. Symbol 57 indicates a second metal layer. Here, insulating film 50 in the present embodiment is formed of a silicon nitride film having a dielectric constant of 3.9 and a thickness of approximately 15 nm, and may be formed of a silicon oxide film.

In the semiconductor device of Embodiment 1, metal layer 55 is formed as a wire or a bonding pad. Insulating film 50, P type semiconductor layer 70, N type semiconductor layer 51 that has been epitaxially grown, N type buried diffusion layer 54 and P type semiconductor substrate 53 exist beneath metal layer 55.

Figure 8:
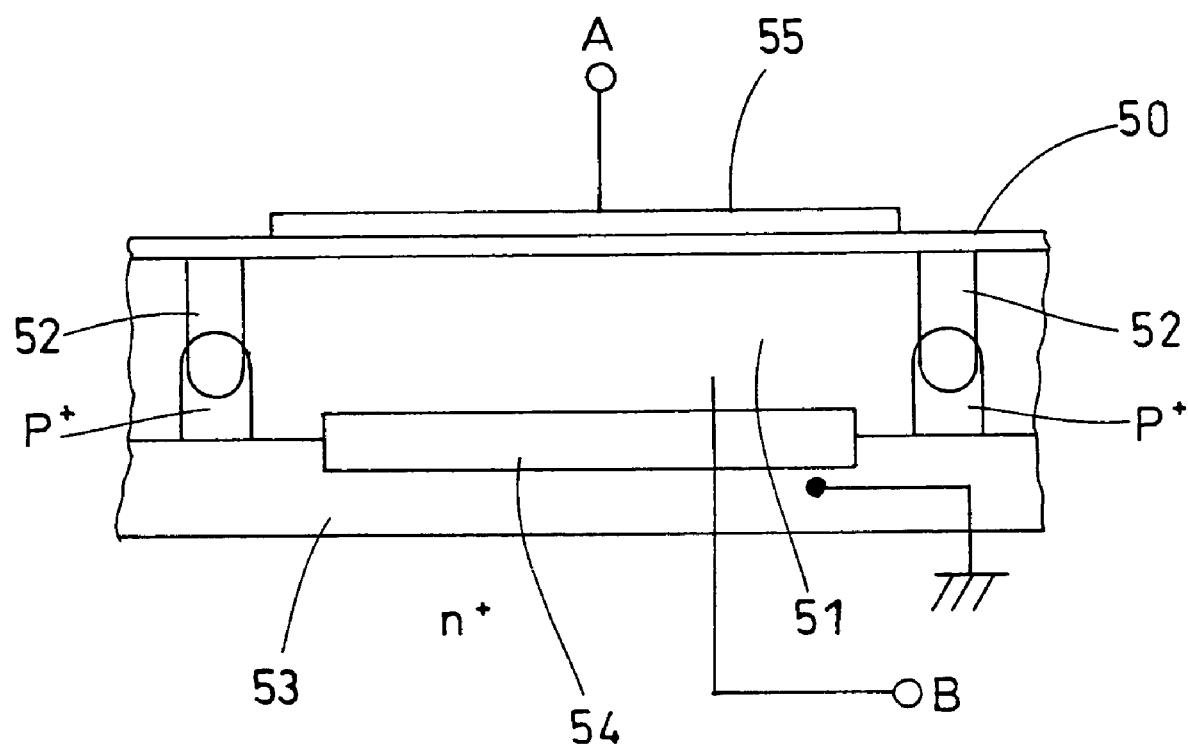
FIG. 8 is a cross-sectional diagram showing a cross-section of the structure of the metal layer and the area in its vicinity in the semiconductor device according to the prior art.

The main difference between Embodiment 1 and the prior art shown in FIG. 8 is that P type semiconductor layer 70 is provided in Embodiment 1, as shown in FIG. 1. N type semiconductor layer 51 is electrically isolated from the other portion of the N type semiconductor layer by means of element isolation layer 52. P type semiconductor layer 70 makes contact with the lower surface of insulating film 50, and is formed by means of diffusion so as to cover the top of N type semiconductor layer 51 and element isolation layer 52. Here, element isolation layer 52 that makes contact with grounded P type semiconductor substrate 53 is formed of a P type diffusion layer, and therefore, P type semiconductor layer 70 also becomes of the ground potential. Accordingly, the surroundings of N type semiconductor layer 51 and N type buried diffusion layer 54 are covered with the grounded P type semiconductor layers (P type semiconductor substrate 53, element isolation layer 52 and P type semiconductor layer 70).

Here, element isolation layer 50 and P type semiconductor layer 70 form a voltage cramp means for cramping the voltage of N type semiconductor layer 51 at the ground potential.

Figure 2:
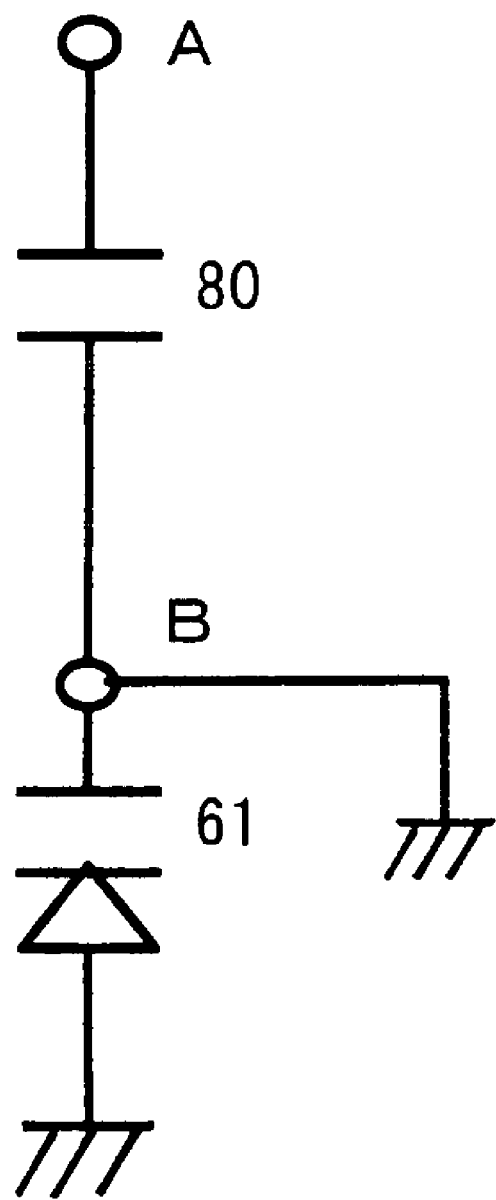
FIG. 2 is a diagram of an equivalent circuit showing the condition of the connection of parasitic capacitances that have been added to metal layer 55 of FIG. 1.
Figure 9:
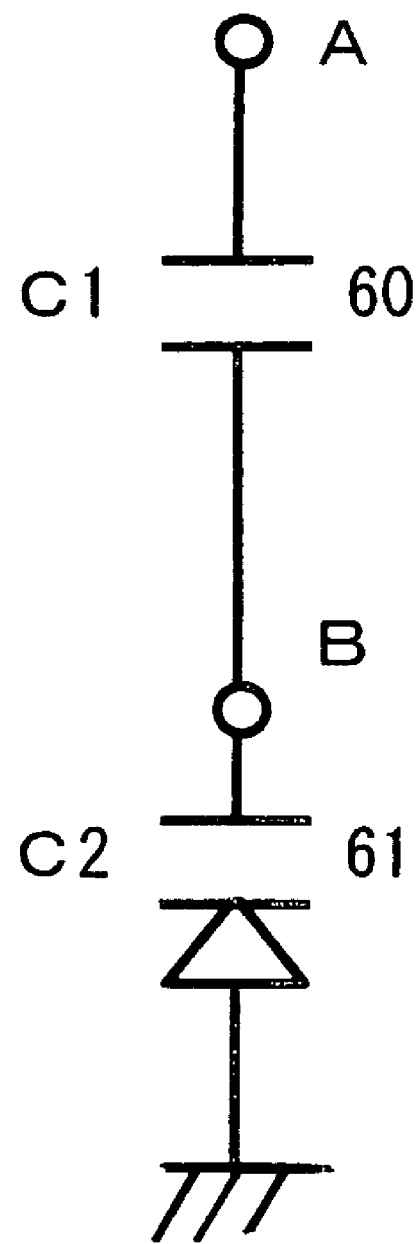
FIG. 9 is a diagram of an equivalent circuit showing the condition of the connection of parasitic capacitances that have been added to metal layer 55 of FIG. 8.
Figure 10:
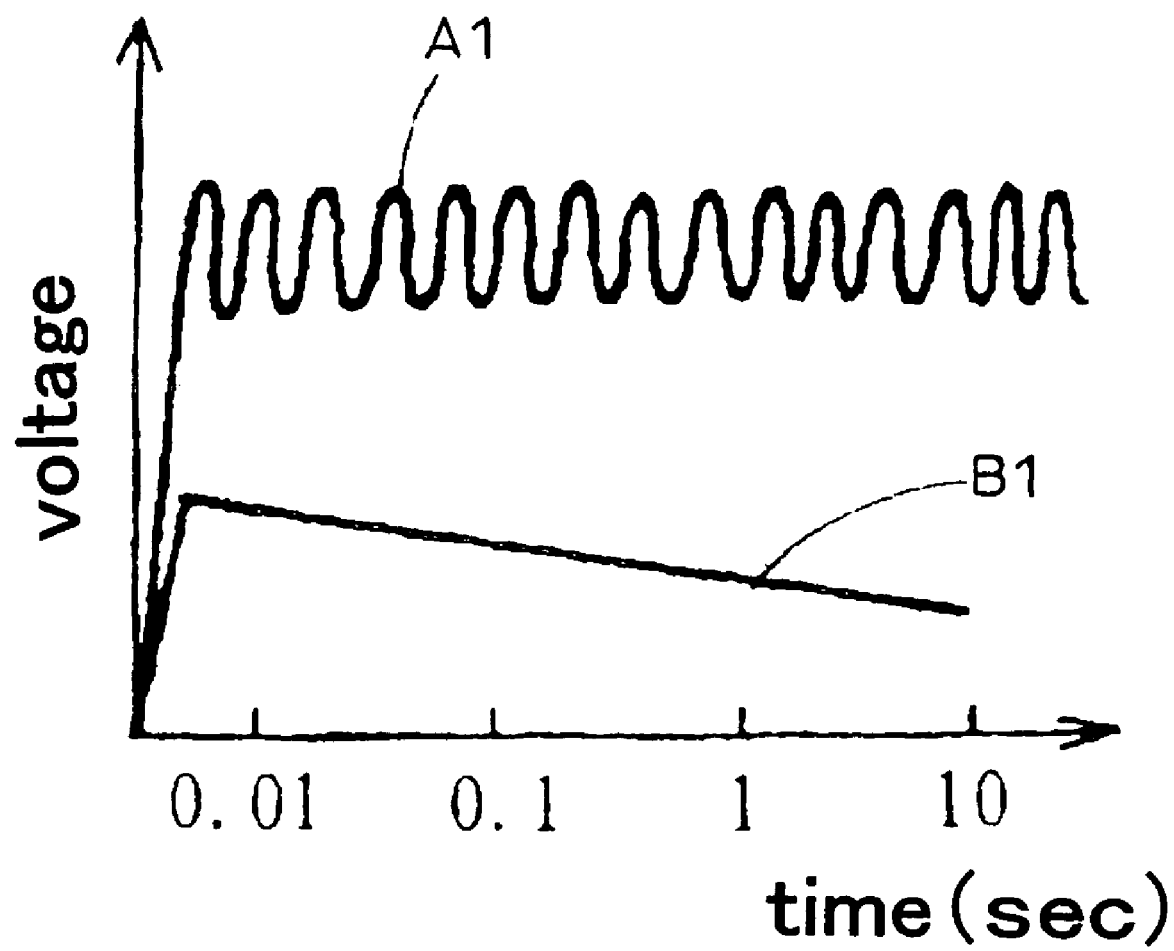
FIG. 10 is a graph showing the timing in fluctuations of the voltages at electrodes A and B of FIG. 9.

FIG. 2 is a diagram of an equivalent circuit showing the condition of the connection of parasitic capacitances that have been added to metal layer 55 of FIG. 1. Here, in the same manner as in the prior art shown in FIG. 9, for the purpose of description, electrode A is added to metal layer 55, and electrode B is added to N type semiconductor layer 51, which is isolated by means of element isolation layer 52 and is located beneath metal layer 55.

Figure 7:
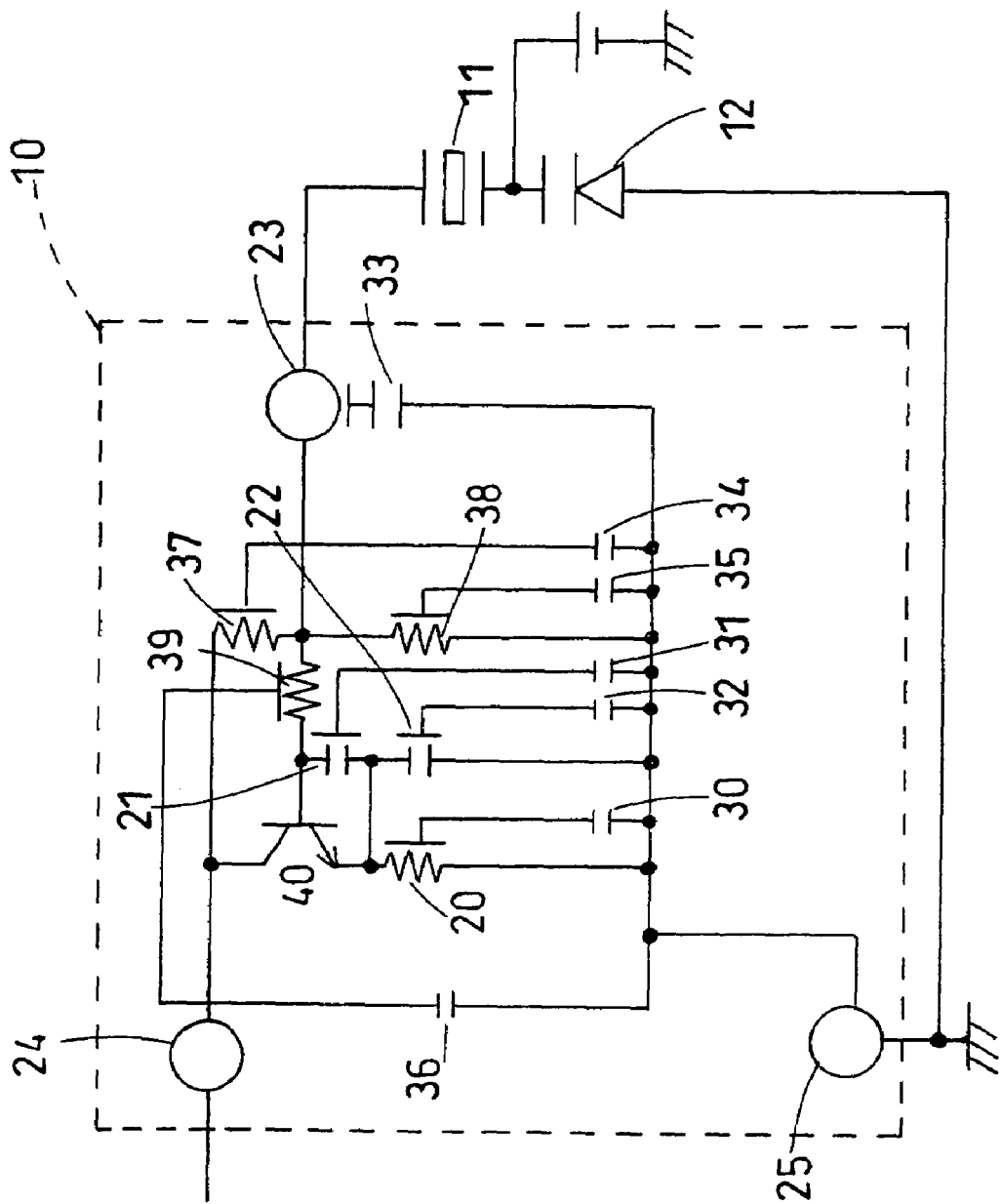
FIG. 7 is a circuit diagram showing the configuration of a crystal oscillating circuit.

In the configuration of FIG. 1, a parasitic capacitance 80 is added by insulating 50 between P type semiconductor layer 70 and electrode A. As a result of this, parasitic capacitance 80 that is created by insulating film 50 and parasitic capacitance 61 are added in series between electrode A and the ground. Parasitic capacitance 61 is the same as parasitic capacitance 61 of the prior art shown in FIG. 9. P type semiconductor layer 70 is grounded, and therefore, even in the case where a voltage is applied to electrode A (metal layer 55), no charge is induced to N type semiconductor layer 51 by this voltage. Accordingly, the value of the parasitic capacitance that has been added to electrode A (that is to say, parasitic capacitance that has been added to metal layer 55) does not change. In the case where the configuration of FIG. 1 is used in capacitors 21 and 22 of the crystal oscillating circuit of FIG. 7, the parasitic capacitances of capacitors 21 and 22 are stable, even after the power supply voltage has been applied to metal layer 55 and the oscillation waveform has appeared in capacitors 21 and 22, and thereby, the fluctuation in the frequency of this oscillation waveform can be suppressed. Concretely speaking, the fluctuation in the frequency eleven seconds after the appearance of the oscillation waveform in metal layer 55 as a result of the application of the power supply voltage to metal layer 55 can be suppressed so as to be no greater than 0.1 ppm.

[Embodiment 2]

Figure 3:
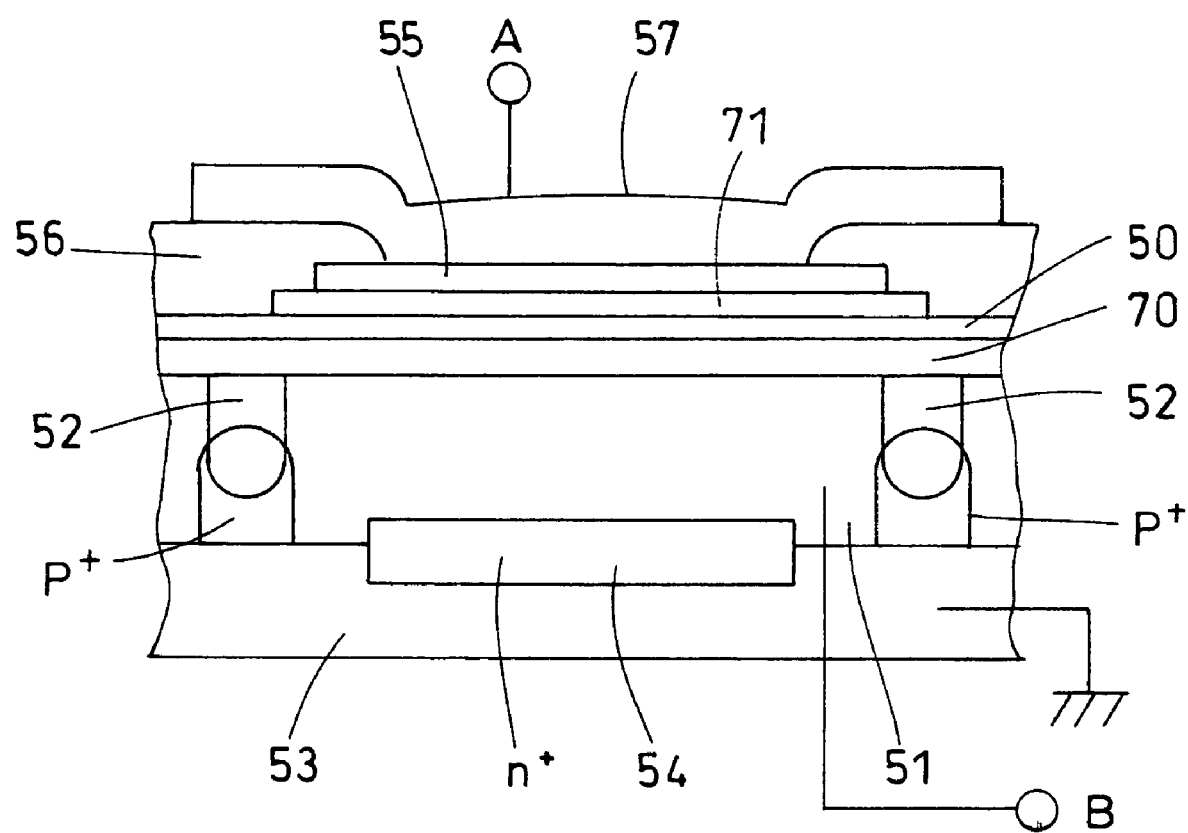
FIG. 3 is a cross-sectional diagram showing a cross-section of the structure of the metal layer and the area in its vicinity in the semiconductor device according to Embodiment 2 of the present invention.

FIG. 3 is a cross-sectional diagram showing a cross-section of the structure of the metal layer and the area in its vicinity in the semiconductor device according to Embodiment 2 of the present invention. In FIG. 3, symbol 71 indicates an insulating film (second insulating film). This insulating film 71 is formed of a silicon oxide film, a silicon nitride film or a resin of which the value of the temperature coefficient of expansion is approximately the same as that of silicon. Here, the same symbols are attached to the same members as those in Embodiment 1 shown in FIG. 1, and the descriptions thereof are therefore omitted.

In this Embodiment 2, insulating film 71 is formed between metal layer 55 and insulating film 50, and the configuration of the remaining portion is the same as in Embodiment 1. The surface where the main surface of insulating film 71 is projected onto N type semiconductor layer 51 includes the surface where metal layer 55 is projected onto N type semiconductor layer 51. Furthermore, the surface of the projection of insulating film 71 exists in the region of N type semiconductor layer 51 which is isolated by element isolation layer 52. That is to say, insulating film 71 is formed within a region above N type semiconductor layer 51 surrounded by element isolation layer 52, and in a region that includes the region where metal layer 55 has been formed.

By having such a configuration, insulating film 50 and insulating film 71 exist directly beneath metal layer 55, and therefore, parasitic capacitances which are created by these insulating films 50 and 71 are connected in series between metal layer 55 and P type semiconductor layer 70.

Figure 4:
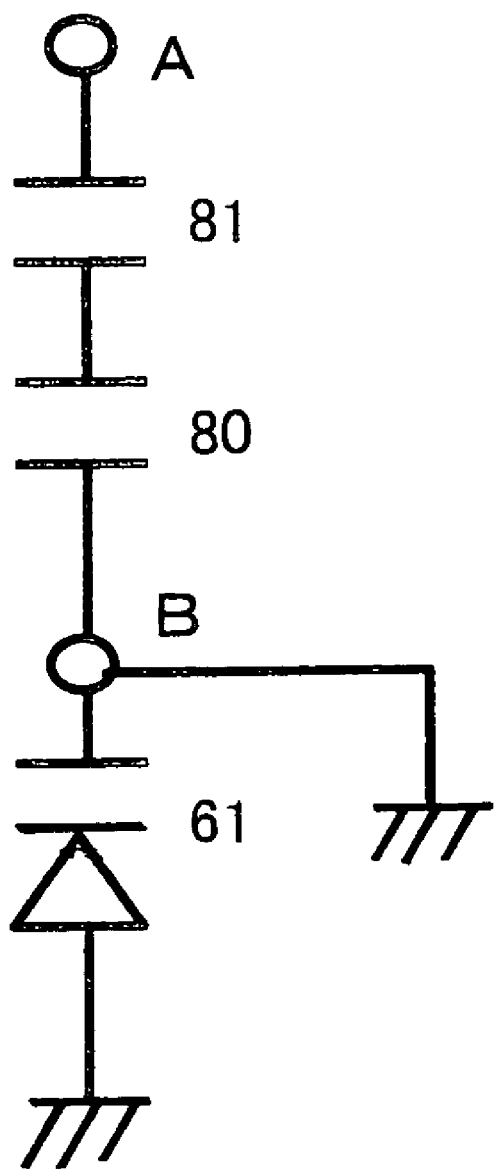
FIG. 4 is a diagram of an equivalent circuit showing the condition of the connection of parasitic capacitances that have been added to metal layer 55 of FIG. 3.

FIG. 4 is a diagram of an equivalent circuit showing the condition of the connection of the parasitic capacitances that have been added to metal layer 55 of FIG. 3. In FIG. 4, symbol 81 indicates a parasitic capacitance created by insulating film 71. Here, in the same manner as in Embodiment 1 shown in FIG. 2, for the purpose of description, electrode A and electrode B are added to the figure, and the same symbols are attached to the same members as those in Embodiment 1 shown in FIG. 2, and the descriptions thereof are therefore omitted.

In the configuration of FIG. 3, insulating film 71 is added to the configuration of FIG. 1. As a result of this, the circuit shown in FIG. 4 has a configuration where parasitic capacitance 81 created by insulating film 71 is added in series to parasitic capacitance 80 created by insulating film 52 in the circuit shown in FIG. 2.

As described above, parasitic capacitances 80 and 81 are added in series between electrode A and electrode B, and therefore, the capacitance value which is added between electrode A and electrode B can further be reduced in comparison with the case where only parasitic capacitance 80 is provided, as shown in FIG. 2. In addition, by reducing the parasitic capacitance value between electrode A and electrode B, the amount of charge that is induced to electrode B when a voltage is applied to electrode A can be comparatively reduced. As a result of this, the fluctuation in the parasitic capacitance value which is added to electrode A due to the discharge of such a charge can be suppressed.

In other words, the thickness of the insulating film (insulating film 50 and insulating film 71) directly beneath metal layer 55 can be increased to a thickness of approximately 350 nm by adding insulating film 71 to the configuration of FIG. 1. Accordingly, the amount of charge that is induced to N type semiconductor 51 directly beneath metal layer 55 can further be reduced. By reducing the amount of charge in the above described manner, a change in the parasitic capacitance that has been added to metal layer 55 with the lapsing of time can be suppressed, so that the amount of fluctuation in the oscillation frequency can further be reduced in the case of application to an oscillating circuit.

Here, insulating film 50 formed of a silicon nitride film or a silicon oxide film has a film thickness as thin as, for example, approximately 15 nm, as described in Embodiment 1, in order to reduce the height of the step of the contact portion, which is not shown. In the case where the film thickness of insulating film 50 is increased, the height of the step of the contact portion which is not shown is increased, causing a problem where the wire in the contact portion may be cut due to the step.

[Embodiment 3]

Figure 5:
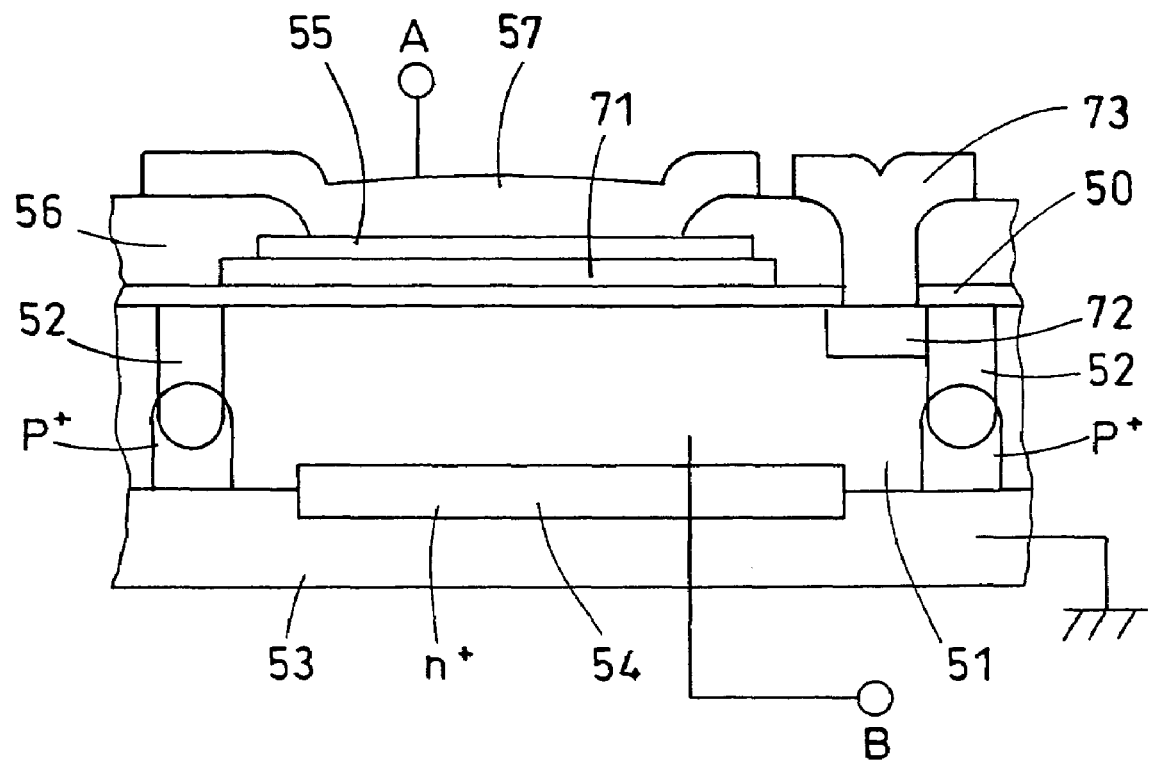
FIG. 5 is a cross-sectional diagram showing a cross-section of the structure of the metal layer and the area in its vicinity in the semiconductor device according to Embodiment 3 of the present invention.

FIG. 5 is a cross-sectional diagram showing the structure of a cross-section of the metal layer and the area in its vicinity in the semiconductor device according to Embodiment 3 of the present invention. In FIG. 5, symbol 72 indicates an N type semiconductor layer of a high impurity concentration which is formed in a portion of N type semiconductor layer 51 from the surface thereof. Symbol 73 indicates a wire connected to N type semiconductor layer 72. These forms a wiring means for voltage clamping which further forms a voltage clamp means. Here, the same symbols are attached to the same members as those in Embodiment 1 shown in FIG. 1, and the descriptions thereof are therefore omitted.

In this embodiment 3, P type semiconductor layer 70 in Embodiment 1 is not provided, but instead, an N type semiconductor layer 72 is formed in a portion of N type semiconductor layer 51 from the surface thereof, and then, a wire 73 for voltage cramping is connected to this N type semiconductor layer 72 so that N type semiconductor layer 51 can be cramped at a predetermined voltage in the configuration. Here, P type semiconductor layer 70 (see FIG. 1) is not provided, and therefore, N type semiconductor layer 51 makes contact with the lower surface of insulating film 50, in the same manner as in the prior art shown in FIG. 8.

Figure 6:
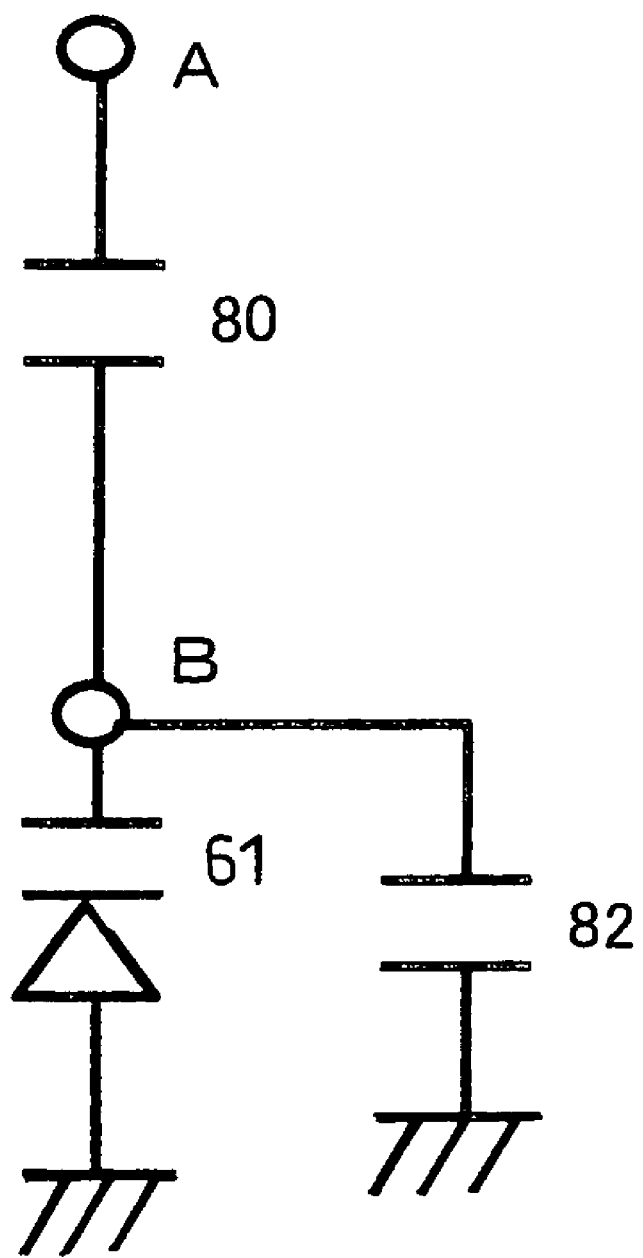
FIG. 6 is a diagram of an equivalent circuit showing the condition of the connection of parasitic capacitances that have been added to metal layer 55 of FIG. 5.

FIG. 6 is a diagram of an equivalent circuit showing the condition of the connection of the parasitic capacitances that have been added to metal layer 55 of FIG. 5. In FIG. 6, symbol 82 indicates a parasitic capacitance which provides a constant potential to N type semiconductor layer 72 and N type semiconductor layer 51 via wire 73. Here, for the purpose of description, as in Embodiment 1, electrode A and electrode B are added to the figure, and the same symbols are attached to the same members as those in Embodiment 1 shown in FIG. 2, and the descriptions thereof are therefore omitted.

In the configuration of FIG. 5, parasitic capacitance 80 is created by insulating film 50 between N type semiconductor layer 51 and electrode A. The potential of N type semiconductor layer 51 is fixed so as not to affect electrode B, even at the time when the potential of electrode A fluctuates, and therefore, the value of the parasitic capacitance that has been added to electrode A (that is to say, the parasitic capacitance that has been added to metal layer 55) does not change. In the case where the configuration shown in FIG. 5 is used for capacitors 21 and 22 in the crystal oscillating circuit shown in FIG. 7, the parasitic capacitances of capacitors 21 and 22 are stable, even after the power supply voltage has been applied to metal layer 55 and oscillation waveform has appeared in capacitors 21 and 22. As a result of this, the fluctuation in the frequency of this oscillation waveform can be suppressed so that an oscillation circuit that satisfies an allowable error margin of 0.2 ppm, for example, can be implemented.

In addition, in the same manner as the configuration shown in FIG. 3 (Embodiment 2) by adding insulating film 71 to the configuration shown in FIG. 1, the same insulating film 71 can be added to the configuration of FIG. 5, increasing the thickness of the insulating film directly beneath metal layer 55, and thereby, the same effects as in Embodiment 2 can be gained.

Here, it is necessary in Embodiments 1 and 2, where P type semiconductor layer 70 is provided, to form element isolation layer 52 of a P type diffusion layer of the same conductivity type as that of semiconductor substrate 53. However, in Embodiment 3, element isolation layer 53 may be formed of a P type diffusion layer or may be formed of an insulating film such as an oxide film that can electrically isolate N type semiconductor layer 51.

INDUSTRIAL APPLICABILITY

A semiconductor device of the present invention is useful as a semiconductor device where a wire or a bonding pad is formed of a metal layer, and is applicable in a field relating to oscillating circuits or the like for cellular phones where stability of the oscillation frequency with high precision is required.

The invention claimed is:

1. A semiconductor device comprising:
   a first semiconductor layer of a first conductivity type;
   a second semiconductor layer of a second conductivity type, which is different from the first conductivity type, formed on said first semiconductor layer;
   an element isolation layer that electrically isolates said second semiconductor layer and that is formed on said first semiconductor layer and around said second semiconductor layer;
   a first insulating film formed on said second semiconductor layer;
   a metal layer that is formed on said first insulating film and that becomes a wire or a bonding pad; and
   a voltage clamp component that clamps the potential of said second semiconductor layer, wherein:
   said element isolation layer is formed of a semiconductor region of the first conductivity type, and
   said voltage clamp component is formed of said element isolation layer and a third semiconductor layer of the first conductivity type which is formed between said second semiconductor layer and said first insulating film and which makes contact with said element isolation layer.

2. The semiconductor device of claim 1 further comprising
   a second insulating film that is formed in a region that includes said metal layer and is provided between the first insulating film and the metal layer.

* * * * *